(12) United States Patent
Sweat et al.

(10) Patent No.: US 11,078,337 B2
(45) Date of Patent: Aug. 3, 2021

(54) HIGH-χ BLOCK COPOLYMERS FOR DIRECTED SELF-ASSEMBLY

(71) Applicant: Brewer Science Inc., Rolla, MO (US)

(72) Inventors: Daniel Sweat, Rolla, MO (US); Kui Xu, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 464 days.

(21) Appl. No.: 15/841,472

(22) Filed: Dec. 14, 2017

(65) Prior Publication Data
US 2018/0163003 A1 Jun. 14, 2018

Related U.S. Application Data

(60) Provisional application No. 62/433,996, filed on Dec. 14, 2016.

(51) Int. Cl.
*C08G 81/00* (2006.01)
*C08G 81/02* (2006.01)
(Continued)

(52) U.S. Cl.
CPC ............ *C08G 81/027* (2013.01); *B32B 27/28* (2013.01); *C08F 293/00* (2013.01); *C08F 293/005* (2013.01); *C08G 63/08* (2013.01); *C08G 65/40* (2013.01); *C08G 81/02* (2013.01); *C08L 53/00* (2013.01); *C08L 87/00* (2013.01); *C08L 87/005* (2013.01); *G03F 7/0002* (2013.01); *G03F 7/16* (2013.01); *G03F 7/20* (2013.01);
(Continued)

(58) Field of Classification Search
CPC .................................................. C08G 81/027
See application file for complete search history.

(56) References Cited

U.S. PATENT DOCUMENTS

| 7,964,107 B2 | 6/2011 | Millward |
| 8,398,868 B2 | 3/2013 | Cheng et al. |
| 9,123,541 B2 | 9/2015 | Xu et al. |
| 9,187,597 B1 | 11/2015 | Boday et al. |
| 9,228,044 B2 | 1/2016 | Boday et al. |
| 9,249,013 B2 | 2/2016 | Wang et al. |

(Continued)

FOREIGN PATENT DOCUMENTS

| TW | 200530278 | 9/2005 |
| WO | 2011/068960 | 6/2011 |

OTHER PUBLICATIONS

Gerardino et al. "Top-down approach to nanotechnology for cell-on-chip applications" (Year: 2010).*

(Continued)

*Primary Examiner* — Austin Murata
(74) *Attorney, Agent, or Firm* — Hovey Williams LLP

(57) ABSTRACT

The present invention is broadly concerned with novel directed self-assembly compositions, processes utilizing those compositions, and the resulting structures that are formed. The composition comprises a block copolymer of polystyrene and a polymethylmethacrylate block with polylactic acid side chains ("PS-b-P(MMA-LA)"). The block copolymer is capable of crosslinking and micro-phase separating into lines and spaces measuring about 10-nm or smaller with sub-20 nm $L_0$ capability. Additionally, PS-b-P(MMA-LA) can be thermally annealed without a top-coat for simpler processing than the prior art. The polylactic acid side chains also increase the etch rate of the poly(methylmethacrylate) block when exposed to oxygen plasma, as well as lower the $T_g$.

17 Claims, 6 Drawing Sheets

(51) Int. Cl.
| | |
|---|---|
| C08F 293/00 | (2006.01) |
| G03F 7/16 | (2006.01) |
| G03F 7/20 | (2006.01) |
| C08L 87/00 | (2006.01) |
| H01L 21/027 | (2006.01) |
| G03F 7/32 | (2006.01) |
| C08G 63/08 | (2006.01) |
| G03F 7/00 | (2006.01) |
| C08L 53/00 | (2006.01) |
| C08G 65/40 | (2006.01) |
| B32B 27/28 | (2006.01) |

(52) U.S. Cl.
CPC .......... *G03F 7/327* (2013.01); *H01L 21/0271* (2013.01); *C08F 2438/03* (2013.01); *C08L 2201/56* (2013.01); *C08L 2203/20* (2013.01)

(56) References Cited

U.S. PATENT DOCUMENTS

| | | | |
|---|---|---|---|
| 2006/0211816 A1 | 9/2006 | Ho et al. | |
| 2007/0293041 A1* | 12/2007 | Yang | H01L 21/0332 438/637 |
| 2009/0042146 A1* | 2/2009 | Kim | B81C 1/00031 430/323 |
| 2011/0294960 A1* | 12/2011 | Hillmyer | C08G 61/08 525/331.9 |
| 2013/0022785 A1 | 1/2013 | Ellison et al. | |
| 2013/0029113 A1 | 1/2013 | Nealey et al. | |
| 2014/0263175 A1 | 9/2014 | Gopalan et al. | |
| 2015/0197594 A1 | 7/2015 | Xu et al. | |
| 2015/0197607 A1* | 7/2015 | Montarnal | C09D 153/00 216/49 |
| 2016/0122571 A1* | 5/2016 | Cheng | C09D 125/14 524/548 |
| 2016/0251539 A1* | 9/2016 | Hustad | G03F 7/0002 427/385.5 |

OTHER PUBLICATIONS

Zhao et al., "SAXS Analysis of the Order—Disorder Transition and the Interaction Parameter of Polystyrene-block-poly (methyl methacrylate)," Macromolecules 2008, 41 (24), 9948-9951.

Yokoyama et al., "Self-Diffusion of Asymmetric Diblock Copolymers with a Spherical Domain Structure," Macromolecules 1998, 31 (22), 7871-7876.

Hardy et al., "Model ABC Triblock Copolymers and Blends near the Order-Disorder Transition," Macromolecules 2002, 35 (8), 3189-3197.

Maeda et al., "Dual Mode Patterning of Fluorine-Containing Block Copolymers through Combined Top-down and Bottom-up Lithography," Chemistry of Materials 2012, 24 (8), 1454-1461.

Bates et al., "Polarity-Switching Top Coats Enable Orientation of Sub—10-nm Block Copolymer Domains," Science, vol. 338 (6108), Nov. 9, 2012, 775-779.

Jung et al., "A Path to Ultranarrow Patterns using Self-Assembled Lithography," Nano Letters, 2010, 10 (3), 1000-1005.

Keen et al., "Behavior of Lamellar Forming Block Copolymers under Nanoconfinement: Implications for Topography Directed Self-Assembly of Sub-10 nm Structures," Macromolecules 2014, 47, 276-283.

Seshimo et al., "Block Copolymer Orientation Control Using a Top-Coat Surface Treatment," Journal of Photopolymer Science and Technology, vol. 25, No. 1 (2012), 125-130.

International Search Report and Written Opinion dated Apr. 19, 2018 in corresponding PCT/US2017/066258 filed Dec. 14, 2017.

Maharana et al., "Synthesis and characterization of poly(lactic acid) based graft copolymers," Reactive and Functional Polymers, 2015, vol. 93, pp. 47-67.

Huda et al., "Synthesis of poly(n-octadecyl methacrylate-co-2-hydroxyethyl methacrylate) copolymer and their utilization as polymeric stabilizer in the preparation of PCL microspheres," Polym. Bull., Published Online Aug. 24, 2016, vol. 74, pp. 1661-1676.

Extended Search Report dated Apr. 2, 2020 in corresponding European Patent Application No. 17881843.1, 9 pages.

Keen et al., "Control of the Orientation of Symmetric Poly(styrene)-block-poly(d,lactide) Block Copolymers Using Statistical Copolymers of Dissimilar Composition," Langmuir, vol. 28, No. 45, Oct. 22, 2012, pp. 15876-15888.

Zalusky et al., "Ordered Nanoporous Polymers from Polystyrene—Polylactide Block Copolymers," J. Am. Chem. Soc., vol. 124, No. 43, Oct. 4, 2002, pp. 12761-12773.

Sveinbjornsson et al., "Rapid self-assembly of brush block copolymers to photonic crystals," Proc Natl Acad Sci U S A, vol. 109, No. 36, Sep. 4, 2012, pp. 14332-14336.

\* cited by examiner

HIGH-χ BLOCK COPOLYMERS FOR DIRECTED SELF-ASSEMBLY

RELATED APPLICATION

The present application claims the priority benefit of U.S. Provisional Patent Application Ser. No. 62/433,996, filed Dec. 14, 2016, entitled HIGH-CHI BLOCK COPOLYMERS FOR DIRECTED SELF-ASSEMBLY, incorporated by reference in its entirety herein.

BACKGROUND OF THE INVENTION

Field of the Invention

This invention pertains to polymers for use in the block copolymer materials used in directed self-assembly.

Description of the Prior Art

The increasing demand of smaller micro-fabricated devices requires a continuous decrease in the feature size of device components. Conventional photolithography techniques become increasingly difficult and costly as the feature size approaches 22 inn and smaller. To keep Moore's law moving forward, non-lithography techniques will become more and more important. An alternative approach to generate nanoscale patterns is directed self-assembly ("DSA") of block copolymers ("BCPs"), which can feasibly provide highly-ordered, patternable morphologies such as lamellae and cylinders at a molecular level (<20 nm).

Currently, the use of DSA for generating lines and spaces utilizing conventional polystyrene ("PS") and poly(methylmethacrylate) ("PMMA") block copolymers ("PS-b-PMMA") has shown to be in the critical dimension range of 12-20 nm half-pitch. A range of methods using both chemoepitaxy and graphoepitaxy pre-patterning process flows have been successful for creating both lines and spaces (lamellae) and contact holes (cylinders). In contrast, the resolution limit for single patterning 193 nm immersion scanners is 37 nm for dense lines and spaces and 40 nm for contact openings.

Typical DSA process flows incorporate several layers. DSA of BCPs is typically performed on an organic, neutral "brush" layer. This brush layer is usually a random copolymer of styrene and methyl methacrylate ("PS-r-PMMA") that has been cured over a long period of time. The block copolymer DSA formulations are then coated on top of the brush layer and annealed. The annealing process causes the block copolymer to arrange itself into alternating organized structures. Optionally, a bottom anti-reflective coating is used to control reflection control of a pre-pattern. This pre-pattern is often formed by standard photolithography techniques, such as the patterning of a photoresist. Etch block layers are also included under the DSA layers to facilitate the pattern transfer process (a silicon- or metal-containing hardmask ("HM") such as $SiO_2$ or TiN). Another etch transfer layer, such as spin-on carbon ("SOC"), may also be under the HM layer in the DSA stack.

Current DSA process flows utilize BCP DSA formulations that are coated to a thickness of around 200-400 Å and annealed. After successful annealing, one of the blocks can then be etched away with the remaining block used as an etch block for the underlying layers or substrate. In a typical PS-b-PMMA BCP formulation, the PMMA etches faster than PS in dry etch conditions. The PMMA is typically all removed while the PS remains on the substrate.

Standard PS-b-PMMA has an inherent feature size limitation of about 13 nm because of its low interaction parameter (χ), a fundamental measure of the block incompatibility in the BCPs. Although using multiple monomers in either block of the copolymer is not common or desired, due to a potential lack of homogeneity and incompatibility between the monomers, the properties of the BCP, such as x, can be altered by the use of comonomers in either block. High-χ BCPs, which usually contain highly polar blocks, fluorine-rich blocks, or silicon-rich blocks, e.g., poly(styrene-b-dimethylsiloxane), poly(styrene-b-2-vinylpyridine), poly(4-tert-butylstyrene-block-methyl methacrylate), poly(4-tert-butylstyrene-block-2-vinylpyridine), poly(styrene-block-isoprene), poly(isoprene-block-lactic acid), etc., are thus under intense research for obtaining 10 nm and sub-10 nm patterns. However, high-χ BCPs are generally difficult to direct and orientate their DSA morphologies due to the disparate polarities and properties between blocks. Specifically, perpendicular orientation of thin film BCP DSA is desired for lithographical application to generate useful nanoscopic patterns on substrates, particularly for lamellar-forming BCPs. Most known high-χ BCPs cannot easily form perpendicularly-orientated morphology by simple thermal annealing as does PS-b-PMMA. They need either an extra top-coat layer or solvent annealing to obtain perpendicular orientation, which can greatly increase the manufacturing cost and complication. This makes incorporating these BCPs into traditional lithographic tracks much more difficult as these are not typical techniques used currently in lithography.

SUMMARY OF THE INVENTION

The present invention addresses the prior art shortcomings by providing a method of forming a microelectronic structure. The method comprises providing a stack comprising a substrate having a surface and one or more optional intermediate layers on the substrate surface. A composition is applied to any intermediate layer(s) present, or to the substrate surface if no intermediate layers are present. The composition comprises a block copolymer comprising a first block and a second block, with the first block being a copolymer that includes recurring monomers comprising lactic acid moieties. The composition is caused to self-assemble into a self-assembled layer, with the self-assembled layer comprising a first self-assembled region and a second self-assembled region different from the first self-assembled region.

In another embodiment, the invention provides a composition comprising a block copolymer dissolved or dispersed in a solvent system. The block copolymer comprises a first block comprising a copolymer that includes recurring monomers comprising lactic acid moieties. The second block comprises a polymer that includes recurring monomers selected from the group consisting of styrene, other styrene-containing monomers, alkyl vinylbenzyl ethers, vinylbenzyl ethers, vinylbiphenyl, vinylbenzocyclobutene, vinylnaphthalene, vinylphenanthrene, vinylanthracene, vinylanisole, vinylpyridine, vinylnaphthalate, and mixtures thereof.

In a further embodiment, the invention is directed towards a microelectronic structure comprising:
  a substrate having a surface;
  one or more optional intermediate layers on the substrate surface; and
  a layer of a self-assembling composition formed on any intermediate layer(s) present, or on the substrate surface, if no intermediate layers are present.

The self-assembling composition comprises a block copolymer comprising a first block and a second block, with the first block being a copolymer that includes recurring monomers comprising lactic acid moieties.

In a further embodiment, the invention is concerned with a block copolymer comprising a first block comprising a copolymer that includes recurring monomers comprising lactic acid moieties. The block copolymer also comprises a second block comprising recurring monomers selected from the group consisting of styrene, styrene, other styrene-containing monomers, alkyl vinylbenzyl ethers, vinylbenzyl ethers, vinylbiphenyl, vinylbenzocyclobutene, vinylnaphthalene, vinylphenanthrene, vinylanthracene, vinylanisole, vinylpyridine, vinylnaphthalate, and mixtures thereof.

In yet another embodiment, the invention is directed towards a method of forming a polymer. The method comprises reacting a lactide with a copolymer including recurring hydroxy-containing monomers so that the lactide reacts with the hydroxy on at least some of the recurring monomers.

DETAILED DESCRIPTION OF THE PREFERRED EMBODIMENTS

Inventive Block Copolymers

Figure 1:
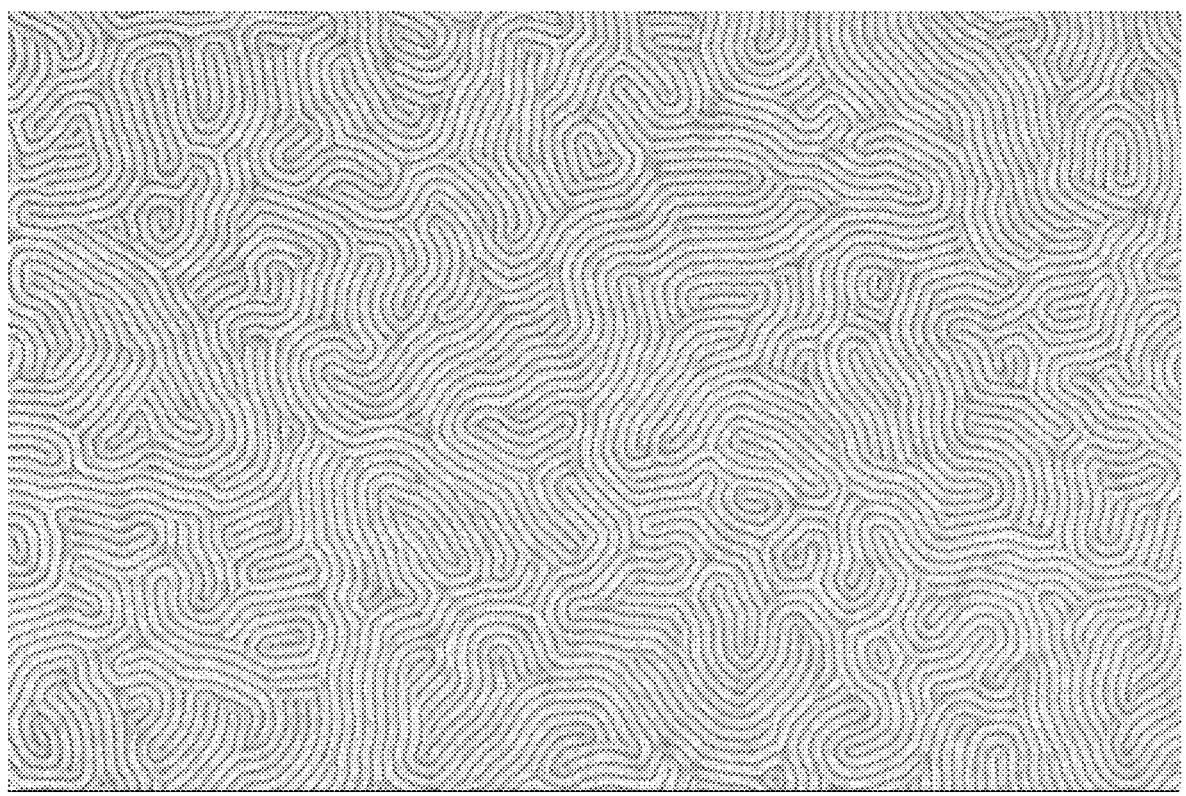
FIG. 1 is an SEM photograph (144 kx) showing a fingerprint obtained from the material of Example 2 with a low PLA loading.

Compositions for use in the present invention are DSA compositions and include a block copolymer (typically a diblock copolymer) dissolved or dispersed in a solvent system. In general, DSA compositions contain two or more immiscible compounds (e.g., polymer blends) or a self-assembling compound comprising at least two components having distinct (and often opposite) characteristics, such as functionality, polarity, or water affinity, etch resistance, etc., which allow segregation (essentially nanophase separation) and alignment of the two compounds or components in a rational manner, as well as selective removal of one compound or component. Block copolymers, as noted above, are particularly well-suited to DSA techniques, as they can be synthesized containing at least two distinct blocks, allowing for each component to align under appropriate conditions, and to be selectively removed after alignment.

Suitable block copolymers for use in the present invention should contain two or more blocks of polymers that self-assemble at the appropriate time (e.g., when annealed). The block copolymer comprises first and second blocks.

1. First Block of Inventive Block Copolymers

The first block is a copolymer that includes recurring monomers ("first recurring monomers") comprising lactic acid moieties. In one preferred embodiment, this copolymer is a random copolymer. In another preferred embodiment, this copolymer is a linear copolymer.

Preferred first recurring monomers comprise —OH groups, and it is preferred that the lactic acid moieties are present as side chains on the recurring monomers by having reacted with at least some of the —OH groups. Particularly preferred first recurring monomers are selected from the group consisting of 2-hydroxyethyl methacrylate monomers, 3-hydroxypropyl methacrylate monomers, and mixtures thereof.

The lactic acid side chain moieties (sometimes referred to as "polylactic acid" or "PLA" herein) preferably have the following structure:

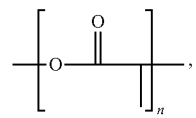

where n is from about 1 to about 40, preferably from about 2 to about 10, and more preferably from about 4 to about 6. The lactic acid side moieties should have a number average molecular weight of from about 100 g/mol to about 5,000 g/mol, preferably from about 200 g/mol to about 2000 g/mol. As used herein, number average molecular weight is determined by NMR as follows: Bruker NMR; 400 MHZ; $CDCl_3$ solvent; Proton NMR; 32 scans; relaxation time of 10 sec.

The lactic acid side moieties preferably have a polydispersity index of from about 1.01 to about 1.60, preferably from about 1.04 to about 1.25. As used herein, polydispersity is measured by GPC. The GPC parameters are: Mobile phase THF; Column—WATERS Styragel HR 4, HR 4E, HR 3, 708×300 mm; Flow rate—1 ml/min; Detector—RI; Column Temperature 40° C.; Polystryrene Standards, PMMA standards, or polylactic acid standards were used for calibration.

The first block preferably further comprises at least one other set of recurring monomers ("second recurring monomers") different from the first recurring monomers (i.e., the first block is a copolymer, as noted above). "Different from the first recurring monomers" does not encompass first recurring monomers that are missing a lactic acid side chain. That is, first recurring monomers that simply fail to include a lactic acid side chain but are otherwise identical to the monomers with a lactic acid side chain are not second recurring monomers. In a preferred embodiment, the second recurring monomers do not also include lactic acid moieties.

Preferred second recurring monomers include those selected from the group consisting of ethylene oxide; vinyl esters; vinyl amides; methacrylates (e.g., methyl methacrylate, ethyl methacrylate, methoxy ethyl methacrylate, di(ethylene glycol) methyl ether methacrylate, poly(ethylene glycol) methacrylate, hydroxyethyl methacrylate, hydroxypropyl methacrylate); acrylates (e.g., methyl acrylate, methyl ether acrylate, ethyl acrylate, methoxy ethyl acrylate, poly(ethylene glycol) acrylate, di(ethylene glycol) methyl ether methacrylate, hydroxypropyl acrylate); ethylene oxide; vinyl esters; vinyl amides; and mixtures thereof. Methyl methacrylate is the most preferred second recurring monomer.

The molar ratio of second recurring monomers (e.g., methylmethacrylate monomer) to first recurring monomers (e.g., hydroxy-containing monomer) is preferably from about 98:2 to about 70:30, from about 95:5 to about 85:15, more preferably about 88:12.

Of the first recurring monomers, the lactic acid side chains are present on at least about 95%, preferably from about 95% to about 100%, more preferably from about 99% to about 100%, and even more preferably about 100% of the first recurring monomers. The molar ratio of second recurring monomer (e.g., methylmethacrylate monomer) to lactic acid moieties is preferably from about 95:5 to about 5:95, from about 80:20 to about 20:80, more preferably about 40:60.

In one embodiment, the first block is free of methyl methacrylate side chains. That is, any methyl methacrylate present as part of the copolymer is only present as a monomer and is part of the copolymer backbone. In another embodiment, the first block is free of any side chains other than the above-described lactic acid side chains (i.e., free of any non-lactic acid side chains). "Free of side chains" in this context means there is less than about 5% by weight, preferably less than about 2% by weight, and preferably about 0% by weight of those sides chains, with the % by weight being based upon the total first block weight taken as 100% by weight.

In another preferred embodiment, other sides chains may be present in the copolymer but in total side chain numbers that are less than the number of lactic acid moiety side chains present. In one aspect of this embodiment, for every side chain present in the copolymer that is not a lactic acid moiety side chain, there are at last about 2 lactic acid moiety side chains, preferably at least about 5 lactic acid moiety side chains, more preferably at least about 10 lactic acid moiety side chains, and more preferably at least about 20 lactic acid moiety side chains.

Additionally, the inventive first block has an etch rate that is at least about 2 times, and preferably at least about 3 times the etch rate of a poly(methylmethacrylate) homopolymer in an oxygen plasma etch.

2. Second Block of Inventive Block Copolymers

The second block of the copolymer is a polymer that preferably comprises recurring monomers selected from the group consisting of styrene, other styrene-containing monomers, alkyl (preferably $C_1$-$C_6$) vinylbenzyl ethers, vinylbenzyl ethers, vinylbiphenyl, vinylbenzocyclobutene, vinylnaphthalene, vinylphenanthrene, vinylanthracene, vinylanisole, vinylpyridine, vinylnaphthalate, and mixtures thereof. Examples of other styrene-containing monomers include those selected from the group consisting of alkyl (preferably $C_1$-$C_6$) styrenes (e.g., methyl styrene, dimethyl styrene, butylstyrene, trimethylstyrene), alkoxy (preferably $C_1$-$C_6$) styrenes (e.g., methoxy styrene), fluorostyrene, difluorostyrene, pentafluorostyrene, benzhydrylstyrene, trifluoromethylstyrene, trimethylsilylstyrene, and mixtures thereof. Some particularly preferred styrene-containing monomers are selected from the group consisting of 4-vinylbiphenyl, 4-methylstyrene, 4-fluorostyrene, 4-vinylbenzocyclobutene, 4-tertbutylstyrene, and mixtures thereof. Further suitable styrene-containing polymers are described more fully in U.S. Pat. No. 9,123,541 and U.S. Patent Application Publication No. 2015-0197594, each of which is incorporated herein in its entirety. Polystyrene is the most preferred second block. In one preferred embodiment, the second block is a homopolymer.

The second block should have a weight average molecular weight of from about 3,000 g/mol to about 60,000 g/mol, and preferably from about 6,000 g/mol to about 20,000 g/mol, with a polydispersity index of from about 1.01 to about 1.60, and preferably from about 1.04 to about 1.25. As used herein, the weight average molecular weight is determined by GPC. The GPC parameters are: Mobile phase THF; Column—WATERS Styragel HR 4, HR 4E, HR 3, 708×300 mm; Flow rate—1 ml/min; Detector—RI; Column Temperature 40° C.; Polystryrene Standards, PMMA standards, or polylactic acid standards were used for calibration.

3. Inventive Block Copolymer Properties

The inventive block copolymers have a weight average molecular weight of from about 2,000 g/mol to about 70,000 g/mol, and preferably from about 6,000 g/mol to about 40,000 g/mol. Furthermore, the polydispersity index of the block copolymer is preferably from about 1.01 to about 1.60, and more preferably from about 1.04 to about 1.25.

The inventive block copolymers have a x value that is at least about 1.5 times, and preferably at least about 2 times the x value of a polystyrene and poly(methyl methacrylate) block copolymer. The inventive block copolymers also have a lowered $T_g$ as compared to a poly(methyl methacrylate) and polystyrene block copolymer. That is, they have a $T_g$ of from about 20° C. to about 100° C., and preferably from about 30° C. to about 70° C.

Additionally, the etch selectivity of the block copolymer is enhanced with this invention. That is, a poly(methyl methacrylate) and polystyrene block copolymer has a PMMA:PS etch selectivity of 2:1 in an oxygen plasma etch. In the present invention, this value is increased to at least about 5:1, and preferably at least about 6:1 by including lactic acid moieties in the PMMA first block in an oxygen plasma etch.

The volume ratio of the blocks in the block copolymer and of lactic acid moieties varies, depending on the desired self-assembly microstructures and properties of the polymer. However, typically the volume ratio of second recurring monomer (methyl methacrylate in the preferred embodiment) to lactic acid moieties is from about 20:80 to about 80:20, preferably from about 40:60 to about 60:40, and more preferably about 50:50. The volume ratio of second recurring monomer (methyl methacrylate in the preferred embodiment) to second block (polystyrene in the preferred embodiment) is typically from about 10:90 to about 90:10, and preferably from about 15:85 to about 85:15. "Volume ratio" as used herein is the ratio of the "volume" of each block of the polymer (where the volume is calculated by taking the molecular weight of that block of the polymer) and dividing it by the density of that block of the polymer.

When the structure being formed is a hole, the volume ratio of second recurring monomer (methyl methacrylate in the preferred embodiment) to second block (polystyrene in the preferred embodiment) will typically be from about 35:65 to about 15:85, and preferably about 25:75. When the structure being formed is a cylinder, the volume ratio of second recurring monomer to second block will typically be from about 65:35 to about 85:15, and preferably about 75:25. When the structure being formed are lamellae, lines, or spaces, the volume ratio of second recurring monomer to second block will typically be from about 35:65 to about 65:35, preferably from about 40:60 to about 60:40, and more preferably about 50:50.

Polymerization Methods

Suitable block copolymers can be created by using reversible-deactivation radical polymerization techniques, such as reversible addition fragmentation chain transfer (RAFT), atom transfer radical polymerization (ATRP), stable free radical mediated polymerization (SFRP), nitroxide mediated radical polymerization (NMP), or combinations thereof.

Scheme A shows a general reaction of using RAFT polymerization to create a block copolymer. The process to create a block copolymer utilizes a two-step reaction. First, one or more monomers (monomer A in Scheme A) is polymerized via RAFT polymerization in the presence of a radical initiator and a chain transfer agent (such as thiocarbonylthio compounds) to generate a polymer (polymer A in Scheme A) with a chain transfer agent moiety (such as thiocarbonylthio) at one chain end. The obtained polymer is then used as a macromolecular chain transfer agent in the second reaction, to effectuate the polymerization of a second monomer (monomer B in Scheme A) in the presence of a radical initiator to generate the block copolymer (A-B in Scheme A).

Scheme A

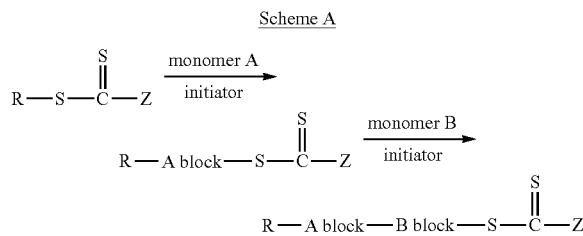

Suitable radical initiators for use in the RAFT polymerization method include, but are not limited to, 2,2'-azobis (2-methylpropionitrile) (AIBN), 4,4'-azobis(4-cyanovaleric acid) (ACVA), and 1,1'-azobis(cyclohexanecarbonitrile) (ACHN).

Suitable chain transfer agents include, but are not limited to, 2-cyano-2-propyl benzodithioate, 2-phenyl-2-propyl benzodithioate, 4-cyano-4-(phenylcarbonothioylthio)pentanoic acid, 2-cyano-2-propyl dodecyl trithiocarbonate, and 4-cyano-4-[(dodecylsulfanyl-thiocarbonyl)sulfanyl]pentanoic acid.

Suitable solvents include, but are not limited to, toluene, 1,4-dioxane, tetrahydrofuran, propylene glycol monomethyl ether acetate, ethyl acetate, propylene glycol monomethyl ether, and anisole.

In one embodiment, a precursor to the first block can be synthesized by polymerizing methylmethacrylate monomers with a hydroxy-containing monomer, such as those noted previously. This first block precursor, which is a MMA-HEMA copolymer in the preferred embodiment, should have a weight average molecular weight of from about 2,000 g/mol to about 40,000 g/mol, and preferably from about 4,000 g/mol to about 20,000 g/mol with a polydispersity index of from about 1.01 to about 1.60, and preferably from about 1.03 to about 1.15.

This first block precursor is then chain extended using styrene monomers or other monomers as noted previously to form the second block, thus yielding an initial BCP. The molar ratio of first block precursor to the second block is preferably from about 20:80 to about 80:20, more preferably from about 30:70 to about 70:30, and even more preferably about 40:60. While these ratios are referring to the initial BCP, it will be appreciated that they will still apply to the final BCP after the lactic acid moieties are added.

This initial BCP is then reacted with a lactide, such as those selected from the group consisting of 3,6-dimethyl-1, 4-dioxane-2,5-dione (DL-lactide), (S,S)-3,6-dimethyl-1,4-dioxane-2,5-dione (L-lactide),(R,R) 3,6-dimethyl-1,4-dioxane-2,5-dione (D-lactide), and combinations thereof. This reaction is a ring-opening polymerization reaction, which is preferably organo-catalyzed, and it creates lactic acid or polylactic acid side chains off the hydroxy-containing monomers in the first block of the block copolymer.

Increased lactic acid content can increase the $L_0$ of the copolymer and shift the neutral window, while likely also increasing the x between the two blocks. Various catalysts can be used for this reaction, including those selected from the group consisting of tin (II) ethylhexanoate, triazabicyclododecene (1,3,5-triazabicyclo[4.4.0]dec-5-ene[TBD]), 1,8-diazabicyclo(5.4.0)undec-7-ene (DBU), other amidine-based and/or guanidine-based catalysts, and mixtures thereof.

Scheme B below shows the general reaction process described above to create the preferred block copolymer according to the invention.

Scheme B

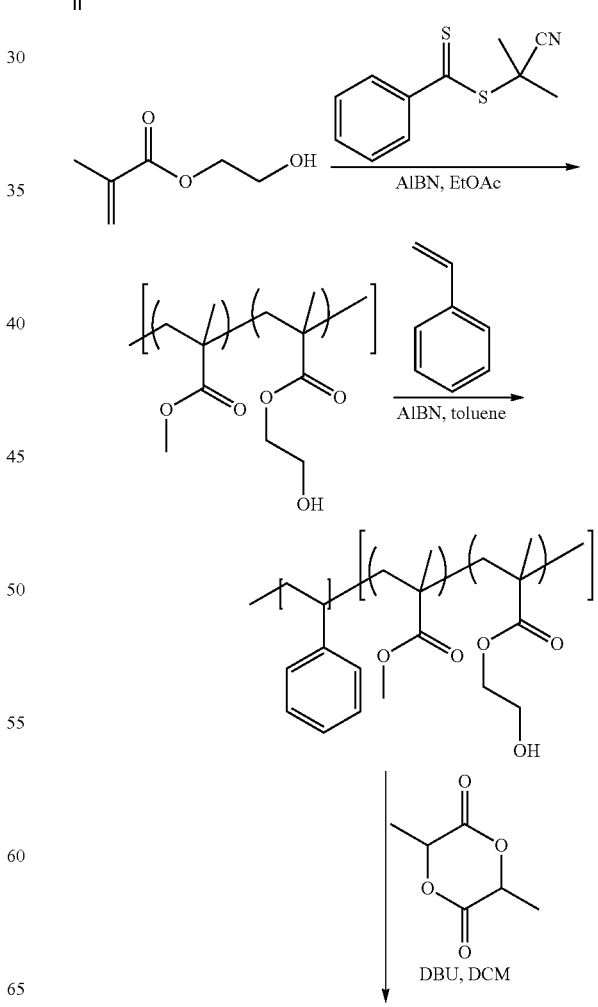

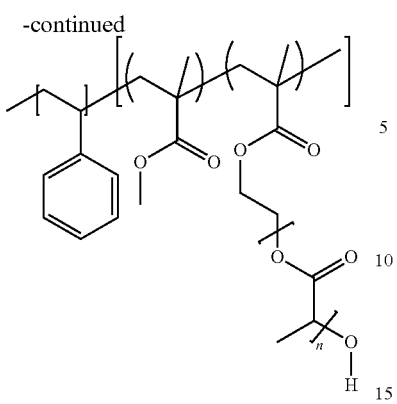

The chemical structure of the resulting block copolymer is shown in Scheme C. It will be appreciated that although the monomers of the first block are shown in a certain order, that is simply exemplary, and those monomers will be random throughout the first block. Additionally, the "x" and "y" simply indicate that what is shown is a snapshot of each overall block. That is, the block will be longer than shown, and will be polymerized to the desired size for the particular application.

Scheme C

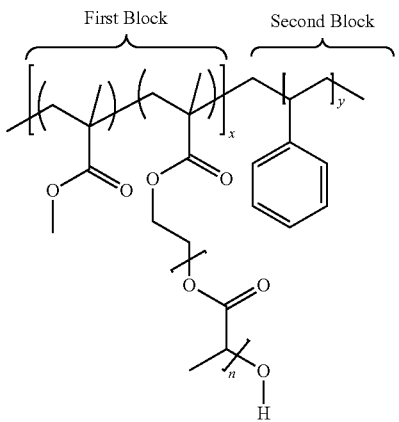

Inventive Composition

In addition to the block copolymer described above, the inventive compositions can include a number of optional ingredients, such as those selected from the group consisting of surfactants, acid catalysts, base catalysts, crosslinkers, and mixtures thereof. The DSA compositions are prepared by dissolving or dispersing the above-described block copolymer in a solvent system. Suitable solvents include those selected from the group consisting of propylene glycol monomethyl ether (PGME), propylene glycol monomethyl ether acetate (PGMEA), gamma-butyrolactone (GBL), cyclohexanone, cyclopentanone, ethyl lactate (EL), ethylacetoacetate (EAA), n-butyl acetate, methyl isobutyl carbinol (MIBC), 2-heptanone, isopropyl alcohol (IPA), methyl ethyl ketone (MEK), and mixtures thereof.

Preferred compositions will preferably have solids content of from about 0.1% by weight to about 5% by weight, more preferably from about 0.1% by weight to about 2% by weight, and even more preferably from about 0.1% by weight to about 1% by weight, based upon the total weight of the composition taken as 100% by weight. The amount of block copolymer in the composition will generally fall within the above ranges as well, since it is most likely the primary (and possibly only) solid present in the composition.

Methods of Using Inventive Compositions

The inventive DSA layer can be formed from the above-described compositions by any known application method, with some of those methods being described in U.S. Pat. No. 9,249,013, the entirety of which is incorporated by reference herein. One preferred method involves spin-coating the block copolymer composition onto a substrate at speeds from about 500 rpm to about 2,500 rpm, preferably from about 1,000 rpm to about 1,500 rpm, for a time period of from about 30 seconds to about 90 seconds, preferably from about 50 seconds to about 60 seconds.

The substrate to which the DSA layer is applied is preferably a semiconductor substrate, such as those selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing. Optional intermediate layers (discussed in more detail below) may be formed on the substrate prior to DSA layer formation, in which case the DSA layer is formed on top of the uppermost/last intermediate layer.

After the block copolymer composition is applied, self-assembly can be carried out using any suitable technique, including thermal annealing, solvent annealing, microwave annealing, and combinations thereof. In a preferred embodiment, thermal annealing is carried out by heating the layer to a temperature above its glass transition temperature ($T_g$). That temperature would typically be from about 100° C. to about 300° C., and more preferably from about 110° C. to about 250° C., for a time period of from about 30 seconds to about 1800 seconds, and preferably from about 60 seconds to about 600 seconds, in order to anneal the material and form the DSA layer. An optional second bake stage may be used to crosslink the material after microphase separation. The thickness of the DSA layer after baking is preferably from about 15 nm to about 60 nm, and more preferably from about 20 nm to about 40 nm, depending upon the molecular weight of each polymer block.

In one embodiment, the self-assembly is carried out right after the DSA composition is applied. In other words, there aren't any additional layers or other compositions applied on top of the DSA layer prior to annealing (i.e., no top coats are needed), as is the case in some prior art methods. Advantageously, the present invention provides for self-assembly to be carried out purely by thermal annealing. That is, some prior art methods require special other conditions (e.g., solvent annealing, annealing in an inert atmosphere), and those are avoided here.

This self-assembly leads to the formation of two distinct regions within the DSA layer, with the orientation of those regions depending upon any layers directly below the DSA layer as well as the particularly type of process utilized. Regardless, one of the assembled regions is removed to yield a pattern that can then be transferred down the stack using conventional methods.

Optional Intermediate Layers

The DSA layer can optionally be coated on top of a series of one or more underlayers that might first be applied to the substrate. Possible intermediate layers are selected from the group consisting of bottom anti-reflective coatings, neutral brush layers, hardmask neutral layers (HM NL), hardmasks, spin-on carbon, or other layers. In some cases, a single layer, such as an HM NL, can perform the function of multiple layers, such as those of the bottom anti-reflective coatings, the neutral brush layer, and the hardmask.

1. Optional Hardmask Layer

One optional intermediate layer is a hardmask layer. A hardmask layer can be formed by any known application method, with one preferred method being spin-coating at speeds from about 1,000 to about 5,000 rpm, and preferably from about 1,250 rpm to about 1,750 rpm, for a time period of from about 30 to about 120 seconds, and preferably from about 45 seconds to about 75 seconds. Suitable hardmask layers are preferably high-silicon content materials, such as those selected from the group consisting of silanes, siloxanes, and silsesquioxanes. Exemplary hardmask layers will generally compromise a polymer dissolved or dispersed in a solvent system, optionally along with one or more the following ingredients: surfactants, acid or base catalysts, and crosslinkers.

Preferred hardmask compositions will preferably have solids content of from about 0.1% by weight to about 70% by weight, more preferably from about 0.5% by weight to about 10% by weight, and even more preferably from about 1% by weight to about 2% by weight, based upon the total weight of the hardmask composition taken as 100% by weight. After the hardmask is applied, it is preferably heated to a temperature from about 100° C. to about 300° C., and more preferably from about 150° C. to about 250° C., and for a time period of from about 30 seconds to about 120 seconds, and preferably from about 45 seconds to about 60 seconds, to evaporate solvents. The thickness of the hardmask layer after baking is preferably from about 5 nm to about 50,000 nm, more preferably from about 5 nm to about 1,000 nm, and even more preferably from about 10 nm to about 100 nm. The hardmask layer should have an etch rate at least 0.75 times that of the block copolymer in a fluorine-rich plasma atmosphere, and at least 5 times slower than any SOC in an oxygen-rich plasma etch atmosphere. The hardmask thickness (or that of any other optional intermediate layer) should not be affected by the solvent in the DSA composition (i.e., no hardmask stripping).

Some commercial hardmask layers can be used. Other preferred hardmask layers contain a copolymer of monomers selected from the group containing phenethyltrimethoxysilane (PETMS), 2-(carbomethoxy)ethyltrimethoxysilane (CMETMS), tetraethoxysilane (TEOS), methyltrimethoxysilane, and phenyltrimethoxysilane.

2. Optional Spin-on Carbon Layer

An optional carbon-rich layer can be formed by any known application method, with one preferred method being spin-coating at speeds from about 1,000 rpm to about 5,000 rpm, and preferably from about 1,250 rpm to about 1,750 rpm, for a time period of from about 30 seconds to about 120 seconds, and preferably from about 45 seconds to about 75 seconds. The term "carbon-rich" refers to layers formed from compositions comprising greater than about 50% by weight carbon, preferably greater than about 70% by weight carbon, and more preferably from about 75% to about 80% by weight carbon, based upon the total solids in the carbon-rich composition taken as 100% by weight. Suitable carbon-rich layers are selected from the group consisting of spin-on carbon layers (SOC), amorphous carbon layers, and carbon planarizing layers.

Exemplary carbon-rich layers will generally compromise a polymer dissolved or dispersed in a solvent system, along with one or more of the following optional ingredients: acid and/or base quenchers, catalysts, crosslinking agents, and surface modification additives. Preferred compositions will be suitable for forming thick layers and will preferably have solids content of from about 0.1% by weight to about 70% by weight, more preferably from about 5% by weight to about 40% by weight, and even more preferably from about 10% by weight to about 30% by weight, based upon the total weight of the carbon-rich composition taken as 100% by weight. After the carbon-rich composition is applied, it's preferably heated to a temperature from about 100° C. to about 300° C., and more preferably from about 160° C. to about 250° C., and for a time period of from about 30 seconds to about 120 seconds, and preferably from about 45 seconds to about 60 seconds, to evaporate solvents. The thickness of the carbon-rich layer after baking is preferably from about 10 nm to about 50,000 nm, more preferably from about 100 nm to about 5,000 nm, and even more preferably from about 500 nm to about 1,500 nm.

While the above describes a preferred embodiment, it will be appreciated that there are a number of variations that could be carried out. These variations are described and shown in detail in U.S. Pat. No. 9,249,013, previously incorporated by reference.

Graphoepitaxy Methods

The invention could be utilized in lithography-assisted (e.g., graphoepitaxy) self-assembly. In summary, a stack is prepared as described above, using a substrate, optional intermediate layer (e.g., carbon-rich layer), and hardmask layer. In embodiments where a hardmask neutral layer is not used, a neutral or brush layer must be used on the hardmask layer to enable the DSA material to self-assemble.

An imaging layer is formed on the cured hardmask layer following conventional methods. Suitable photosensitive compositions for use as the imaging layer include any composition that can be patterned upon exposure to at least about 1 mJ/cm$^2$ radiation, such as photoresists, anti-reflective imaging layers, and the like. The imaging layer can then be post-application baked ("PAB") at a temperature of at least about 80° C., and preferably from about 100° C. to about 140° C., for time periods of from about 10 seconds to about 120 seconds (preferably from about 30 seconds to about 60 seconds). The thickness of the imaging layer is preferably from about 10 nm to about 300 nm, more preferably from about 20 nm to about 150 nm, and even more preferably from about 30 nm to about 100 nm.

That imaging layer can then be patterned, for example, by exposure to radiation (e.g., light in the case of optical lithography) of the appropriate wavelength, followed by development of the unexposed portions of the imaging layer, again following conventional methods. For example, the imaging layer could be exposed using a mask positioned above the imaging layer.

The mask has open areas designed to permit radiation (hv) to pass through the mask and contact the imaging layer to yield exposed portions of the imaging layer that are rendered insoluble in solvent (when using a negative-tone photoresist). The remaining solid portions of the mask are designed to prevent radiation from contacting the imaging layer in certain areas to yield unexposed portions of the imaging layer that remain solvent soluble. Those skilled in the art will readily understand that the arrangement of open areas and solid portions is designed based upon the desired pattern to be formed in the imaging layer, although the present method is particularly suited for dark-field exposure where the majority of the imaging layer is shielded from radiation to form raised features such as lines and pillars. After exposure, the imaging layer is preferably subjected to a post-exposure bake ("PEB") at a temperature of from about 80° C. to about 150° C., more preferably from about 100° C. to about 130° C., for a time period of from about 30 seconds to about 60 seconds.

Upon exposure, the portions of the imaging layer that are exposed to radiation are rendered insoluble in organic (preferably non-alkaline) solvent developer. The exposed imaging layer is then contacted with solvent to remove the unexposed portions to form the desired "pre-pattern" in the imaging layer. Alternatively, when using a positive-tone photoresist, the exposed portions of the imaging layer can be rendered soluble in aqueous developer (e.g., an alkaline developer) or solvent during the exposure process, in which case, the removal process is reversed from what is described above. That is, the exposed portions are removed during development to form the pattern (not shown). In either embodiment, at least about 95% of the unexposed (or exposed, as the case may be) portions of the imaging layer will preferably be removed by developer, more preferably at least about 99%, and even more preferably about 100% will be removed. Suitable non-alkaline solvent developers include n-butyl acetate, n-butyl propionate, isobutyl butyrate, and/or ketones (e.g., 2-heptanone). Suitable alkaline developers for positive-tone imaging layers are organic or inorganic alkaline solutions such as potassium hydroxide (KOH) and tetramethyl ammonium hydroxide (TMAH), and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan).

Thus, pre-pattern formation results in portions of the hardmask layer underneath the imaging layer being uncovered or exposed when those selected portions of the imaging layer are removed from the stack. The resulting pre-pattern preferably comprises raised features (e.g., lines, pillars, square islands, or combinations thereof) formed on the hardmask layer. These features are chemically identical to the exposed portions of the imaging layer, and are each defined by respective sidewalls and respective top surfaces. It will be appreciated that in alternative embodiments, any other suitable patterning process may be used to pattern the imaging layer and form raised features, including multiple patterning processes, as well as immersion lithography. As mentioned above, it will also be appreciated that a positive-tone resist or photosensitive material could also be used, instead of the negative-tone imaging layer described herein. In that case, the unexposed portions of the imaging layer remain insoluble, while the exposed portions are rendered soluble and are removed with developer. Other patterning methods may also be used, including emerging technologies, such as imprint lithography, nano-imprint lithography, hot embossing lithography, and stamping pattern transfer. These technologies use a patterned mold to transfer patterns instead of relying on photolithographic patterning, as described above.

Regardless of the embodiment, once the desired pre-pattern is formed, a DSA composition according to the invention can be applied to the patterned stack, such that it flows into the spaces between the raised features (i.e., directly adjacent the hardmask), and adjacent the sidewalls of the raised features. In one or more embodiments, the self-assembling composition can also overcoat the top surfaces of the raised features. However, in other embodiments, the self-assembling composition preferably does not overcoat the top of the raised features. In other words, the self-assembling composition is deposited between the raised features and adjacent the feature sidewalls, but is absent from the top surfaces of the raised features. As a result, the top surface of the raised features remain open to be easily removed via solvent removal or etching, without the need for an etch-back step or other modification of the self-assembling layer to expose the pre-pattern.

The DSA composition can then be self-assembled or annealed as described above to yield first self-assembled regions and second self-assembled regions in the self-assembled or annealed layer, with one of the first or second self-assembled regions being adjacent the raised feature sidewalls, and the other of the first or second self-assembled regions segregated away from the raised features. For example, the first blocks (i.e., the P(MMA+LA) blocks) would align adjacent to the photoresist sidewalls, while the second blocks (i.e., the styrene-containing blocks) would be drawn towards each other and are segregated between adjacent self-assembled regions of the first blocks.

Either of the first or second self-assembled regions can then be removed to generate a pattern. For example, the first self-assembled region can then be removed to generate a pattern in the DSA layer on the patterned stack, followed by transferring this pattern down into the hardmask and carbon-rich intermediate layer. It will be appreciated that instead of the first self-assembled region, the second self-assembled region could be removed instead. Regardless, the resulting pattern is eventually transferred down into the substrate. The pattern will typically be comprised of features such as lamellae, lines, spaces, cylinders, and/or holes. Advantageously, these features will have an average (mean) respective feature size of less than about 20 nm, preferably less than about 15 nm, more preferably less than about 10 nm, and even more preferably from about 1 nm to about 10 nm. The term "feature size," as used herein, refers to the average (mean) width of the features as measured on an SEM cross-section of the stack (thus in the case of holes the width is the same as the hole diameter).

Chemoepitaxy Methods

One advantage of the present invention is that, in embodiments where a hardmask neutral layer is utilized, the surface properties of that layer can be modified from a neutral layer that will facilitate aligning of the self-assembling materials to a non-alignment layer over which the self-assembling materials will not align during annealing or self-assembly. One possible avenue for modifying the hardmask layer involves chemoepitaxy. A stack is prepared comprising a substrate, optional intermediate layer, hardmask neutral layer, and imaging layer, as described above. A pre-pattern is created in the imaging layer, either using the method described previously, or any other conventional method. Thus, pre-pattern formation results in portions of the hardmask layer underneath the imaging layer being uncovered or exposed when those selected portions of the imaging layer are removed from the stack. The remaining portions of the imaging layer adjacent the hardmask serve as a mask for surface modification of the hardmask neutral layer. In one or more embodiments, the imaging layer is patterned using optical lithography and a developer (e.g., alkaline developer) or solvent rinse. Alternatively, the imaging layer is patterned using another suitable method, followed by contact with a developer solution (e.g., alkaline developer) or solvent. Regardless, the exposed portions of the hardmask layer are contacted with a developer solution (separately or during developer rinse). The remaining portions of the imaging layer are then removed (e.g., with solvent), yielding the hardmask layer having surface-modified regions and non-modified regions, where the surface-modified regions correspond to those portions of the hardmask that were uncovered during patterning of the imaging layer. Advantageously, contact with the developer (and particularly with an alkaline developer) changes the surface energy of the hardmask layer. In one or more embodiments, the surface energy is increased and causes the surface-modified regions of the hardmask to lose their ability to act as a neutral layer and induce alignment during the self-assembly process. However, the non-modified regions of the hardmask, which remained covered by the imaging layer during patterning and developer contact, still retain their neutral layer properties. Thus, the surface-modified regions correspond to non-aligning areas while the non-modified regions correspond to aligning areas on the hardmask. The active aligning areas therefore have the ability to become guiding structures for pattern formation during self-assembly.

A DSA layer is then formed directly on top of the surface-modified hardmask layer, such that there is direct contact between the DSA layer and surface-modified regions and non-modified regions. The DSA layer is then self-assembled as described above to allow the components to self-assemble. Because of the surface modification, the self-assembling layer will only self-assemble into first self-assembled regions and second self-assembled regions in those portions of the DSA layer that are adjacent the non-modified areas of the hardmask. In other words, portions of the DSA layer adjacent the surface-modified areas of the hardmask do not separate or segregate into a pattern during annealing or self-assembly and are "unassembled" or "non-aligned." One of the first or second self-assembled regions can then be selectively removed, followed by etching the resulting pattern into the hardmask layer and optional intermediate layer. This pattern is eventually transferred down into the substrate.

In embodiments where a hardmask neutral layer is not utilized, an intermediate layer is required that will form modified and non-modified areas or regions, and the rest of the process would proceed as described above. In a further embodiment, this intermediate layer could be patterned directly, thus avoiding the need to use an imaging or photoresist layer that must ultimately be removed. That is, selective exposure to radiation will result in the creation of the surface-modified areas or regions noted above.

It will be appreciated that in each of the foregoing methods, self-assembly or annealing results in nanophase separation in the DSA layer, which permits the formation of nanometer-sized patterns (e.g., 10 nm or even sub-10 nm) generally not achievable using conventional optical lithography techniques. It will also be appreciated that although the present methods illustrate formation of at least two distinct annealed or self-assembled regions in the DSA layer, it is envisioned that additional DSA materials could be formulated that are capable of separation into more than two distinct phases, including third and fourth annealed or self-assembled regions.

EXAMPLES

The following examples set forth preferred methods in accordance with the invention. It is to be understood, however, that these examples are provided by way of illustration and nothing therein should be taken as a limitation upon the overall scope of the invention.

Example 1

Synthesis of P(MMA-r-HEMA)

Methyl methacrylate (19.02 g, Sigma Aldrich, St. Louis, Mo.), 2-hydroxyethyl methacrylate (1.30 g, Sigma Aldrich, St. Louis, Mo.), 2-cyano-2-propyl benzodithioate (0.161 g, Strem Chemicals Inc., Newburyport, Mass.), 2,2'-azobis(2-methylpropionitrile) (0.015 g, Sigma Aldrich, St. Louis, Mo.), and ethyl acetate (30 g, Alfa Aesar, Ward Hill, Mass.) were added to a round bottom flask and purged for 30 minutes with $N_2$. The reaction was heated at 60° C. for 16 hours before being cooled to room temperature, diluted with acetone (Sigma Aldrich, St. Louis, Mo.) and precipitated into hexanes (450 mL, Alfa Aesar, Ward Hill, Mass.). The resulting powder was collected by vacuum filtration and dried under vacuum overnight at 45° C. Finally, 10.8 grams of P(MMA-r-HEMA) was collected and analyzed by GPC to be 13.1 kg/mol relative to PS standards with a PDI of 1.07.

Example 2

Chain Extension with Styrene

In this procedure, 1.6 grams of 13.1k P(MMA-r-HEMA) from Example 1 was mixed with 9.37 grams of styrene (TCI America, Portland, Oreg.), 4.2 milligrams of 2,2'-azobis(2-methylpropionitrile) (Sigma Aldrich, St. Louis, Mo.), and 9 grams of toluene (Sigma Aldrich, St. Louis, Mo.). The solution was purged with $N_2$ for 30 minutes and heated to 80° C. for 16 hours before being cooled to room temperature, diluted with acetone (Sigma Aldrich, St. Louis, Mo.), and precipitated into a 2:1 (v/v) mixture of cyclohexane (Alfa Aesar, Ward Hill, Mass.) to hexanes (Alfa Aesar, Ward Hill, Mass.). The resulting powder was collected by vacuum filtration and dried under vacuum overnight at 45° C. Finally, 3.0 grams of P(MMA-r-HEMA)-b-PS was collected and analyzed by GPC to be 31.8 kg/mol relative to PS standards with a PDI of 1.12.

Example 3

Chain Extension with Styrene, 4-Vinylbiphenyl, and 4-Methylstyrene

In this Example, 1.6 grams of 13.1k P(MMA-r-HEMA) from Example 1 was mixed with 2.58 grams of styrene (TCI America, Portland, Oreg.), 1.98 grams of 4-vinylbiphenyl (Proactive Molecular Research, Alachua, Fla.), 2.27 grams of 4-methylstyrene (Sigma Aldrich, St. Louis, Mo.), 4.2 milligrams of 2,2'-azobis(2-methylpropionitrile) (Sigma Aldrich, St. Louis, Mo.), and 9 grams of toluene (Sigma Aldrich, St. Louis, Mo.). The solution was purged with $N_2$ for 30 minutes and heated to 80° C. for 16 hours before being cooled to room temperature, diluted with acetone (Sigma Aldrich, St. Louis, Mo.) and precipitated into a 2:1 (v/v) mixture of cyclohexane (Alfa Aesar, Ward Hill, Mass.) to hexanes (Alfa Aesar, Ward Hill, Mass.). The resulting powder was collected by vacuum filtration and dried under vacuum overnight at 45° C. Finally, 3.1 grams of P(MMA-r-HEMA)-b-P(S-r-VBP-r-4-methylstyrene) was collected and analyzed by GPC to be 28.0 kg/mol relative to PS standards with a PDI of 1.11.

Example 4

Chain Extension with Styrene, 4-Vinylbiphenyl, and 4-Methylstyrene

In this procedure, 1.6 grams of 13.1k P(MMA-r-HEMA) prepared in Example 1 was mixed with 2.29 grams of styrene (TCI America, Portland, Oreg.), 1.98 grams of 4-vinylbiphenyl (Proactive Molecular Research, Alachua, Fla.), 2.60 grams of 4-methylstyrene (Sigma Aldrich, St. Louis, Mo.), 4.2 milligrams of 2,2'-azobis(2-methylpropionitrile) (Sigma Aldrich, St. Louis, Mo.), and 9 grams of toluene (Sigma Aldrich, St. Louis, Mo.). The solution was purged with $N_2$ for 30 minutes and heated to 80° C. for 16 hours before being cooled to room temperature, diluted with acetone (Sigma Aldrich, St. Louis, Mo.) and precipitated into a 2:1 (v/v) mixture of cyclohexane (Alfa Aesar, Ward Hill, Mass.) to hexanes (Alfa Aesar, Ward Hill, Mass.). The resulting powder was collected by vacuum filtration and dried under vacuum overnight at 45° C. Finally, 3.1 grams of P(MMA-r-HEMA)-b-P(S-r-VBP-r-4-methylstyrene) was collected and analyzed by GPC to be 27.6 kg/mol relative to PS standards with a PDI of 1.14.

Example 5

PLA Polymerization

PLA polymerization was accomplished by adding either 0.2 grams or 0.3 grams of 3,6-dimethyl-1,4-dioxane-2,5-dione (Sigma Aldrich, St. Louis, Mo.) to 1.00 gram of the BCPs generated in Examples 2, 3, and 4 to an oven-heated flask cooled under dry $N_2$. Next, 30 milliliters of dichloromethane (Sigma Aldrich, St. Louis, Mo.) was added and the solution was stirred until all solids dissolved, after which 0.4 milliliters of a 5% (v/v) solution of 1,8-diazabicyclo[5.4.0]undec-7-ene (Sigma Aldrich, St. Louis, Mo.) in dichloromethane was added, and the reaction stirred for 30 minutes under dry $N_2$ at room temperature. The polymer was precipitated by pouring the solution into acidified methanol (3 milliliters of 1 M HCl [Sigma Aldrich, St. Louis, Mo.] in 300 milliliters of methanol [ Sigma Aldrich, St. Louis, Mo.]). The resulting polymer was collected by gravity filtration and dried overnight under vacuum at 45° C. Yield for all polymerizations was approximately 0.94 grams with molecular weights and PDIs as shown in Table 1.

Example 6

Self-Assembly Testing

Silicon wafers were prepared for self-assembly by first coating with a 0.5 wt % solution of hydroxyl-terminated random copolymer of P(S-r-MMA) comprising 30% PS and 70% MMA (Tokyo Chemical Industries America, Portland, Oreg.) in PGMEA (Heraeus Precious Metals North America, Vandalia, Ohio). The resulting ~12-nm-thick film was annealed at 250° C. for 5 minutes and then stripped with PGMEA to remove unreacted brush. The treated wafer was then coated with the BCP (1.2 wt % in PGMEA) and baked at 205° C. for 5 minutes to complete the self-assembly process. The resulting BCP film was then etched in an oxygen plasma using the following parameters: 100 W power, 60 mtorr chamber pressure and 30 sccm of $O_2$ for 5 seconds.

Figure 2:
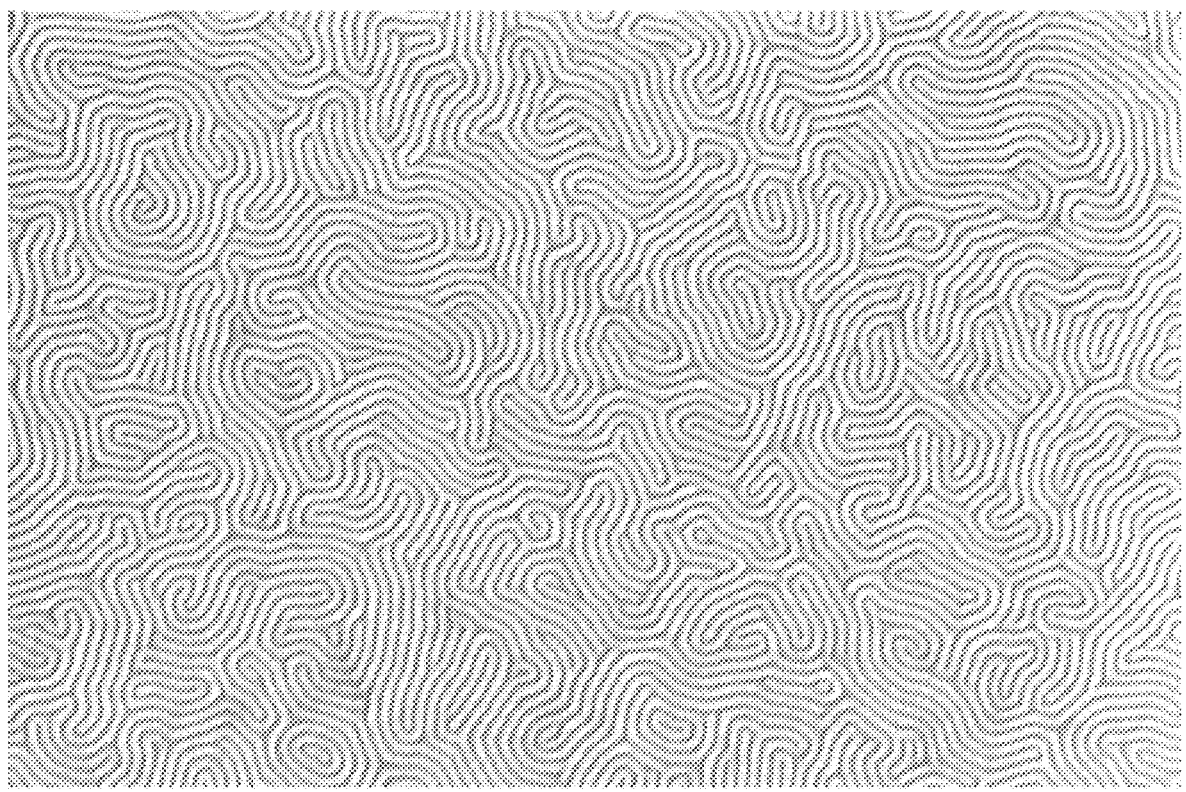
FIG. 2 is an SEM photograph (144 kx) showing a fingerprint obtained from the material of Example 2 with a high PLA loading.
Figure 3:
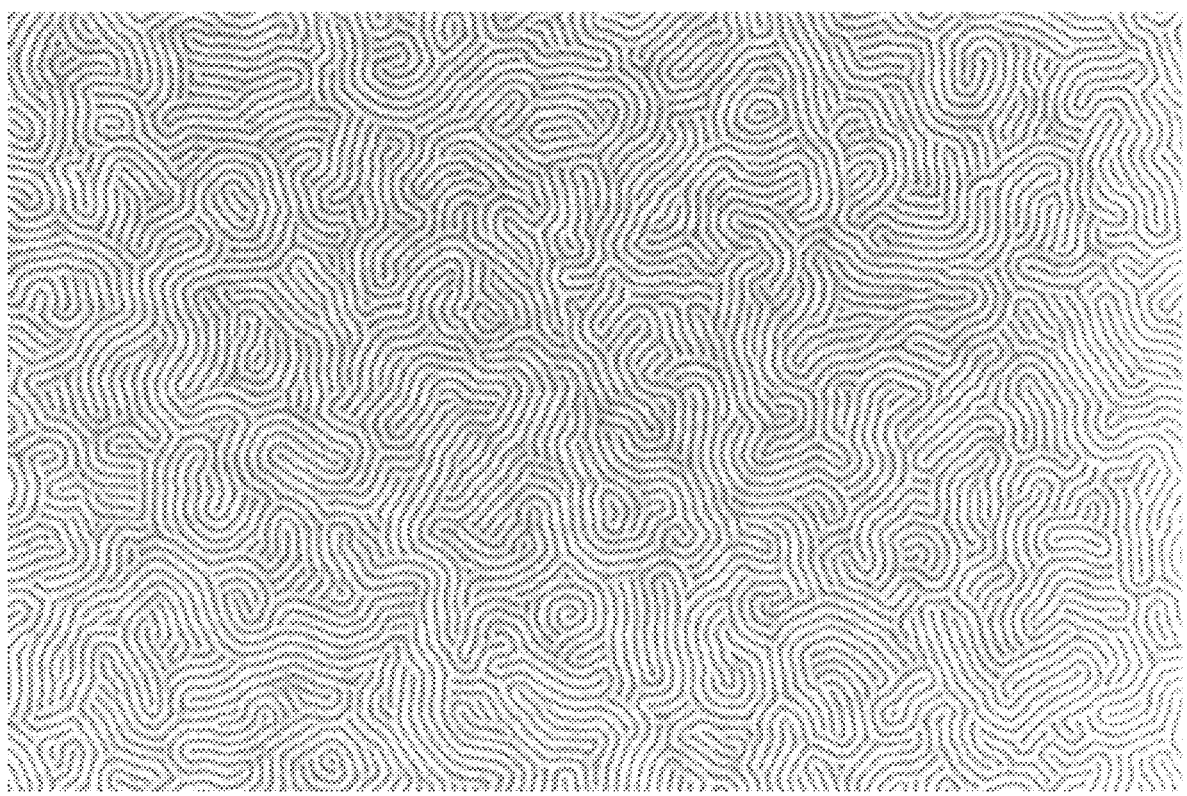
FIG. 3 is an SEM photograph (144 kx) showing a fingerprint obtained from the material of Example 3 with a low PLA loading.
Figure 4:
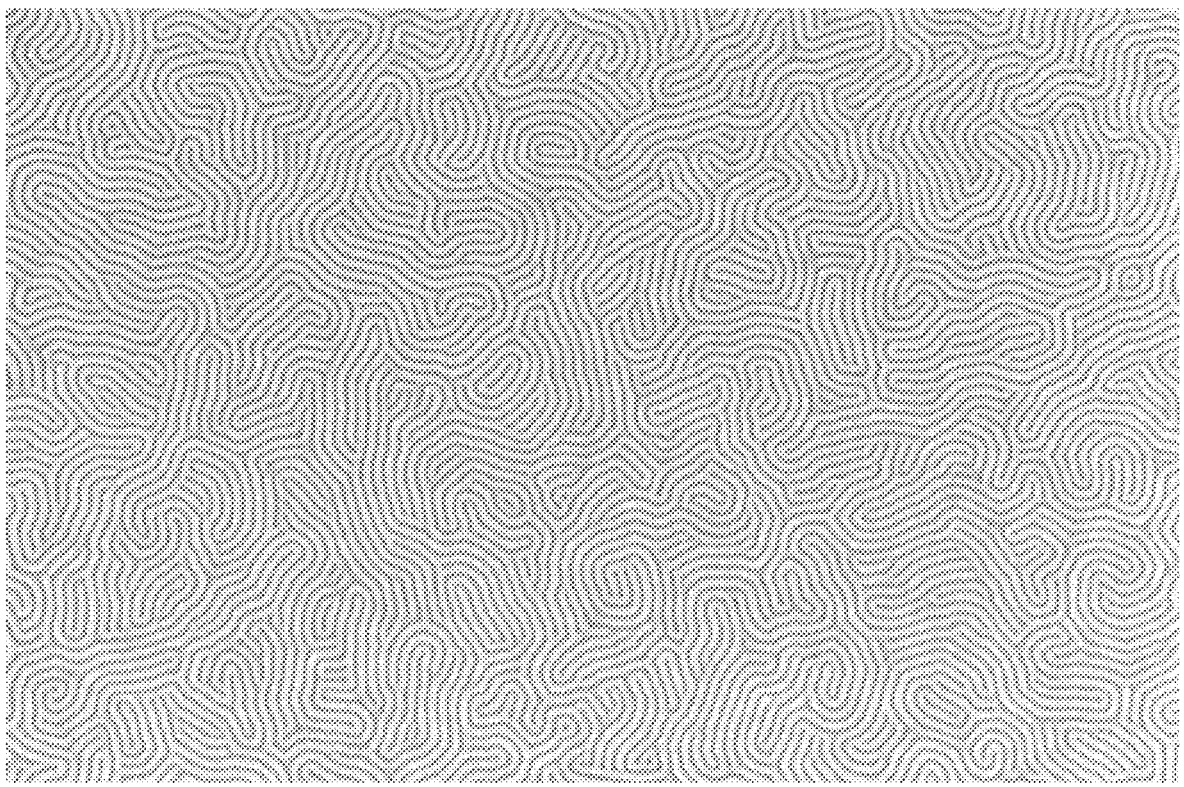
FIG. 4 is an SEM photograph (144 kx) showing a fingerprint obtained from the material of Example 3 with a high PLA loading.
Figure 5:
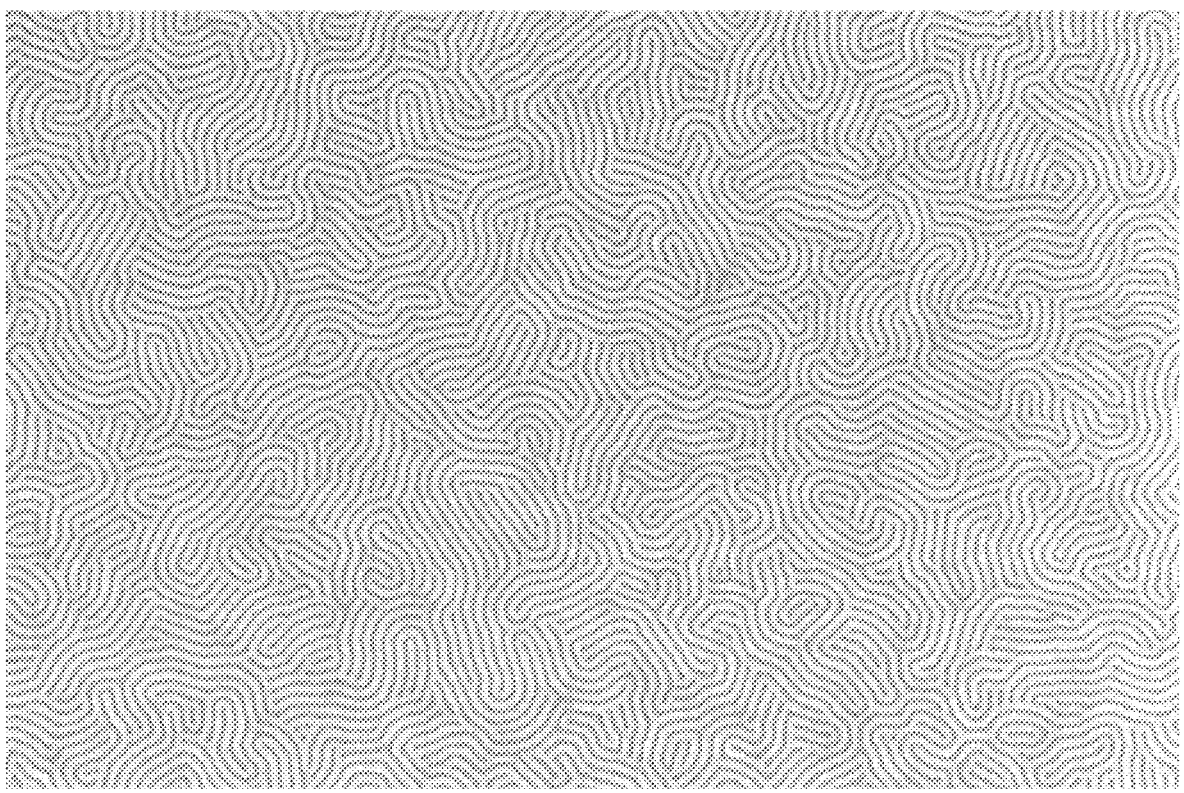
FIG. 5 is an SEM photograph (144 kx) showing a fingerprint obtained from the material of Example 4 with a low PLA loading.
Figure 6:
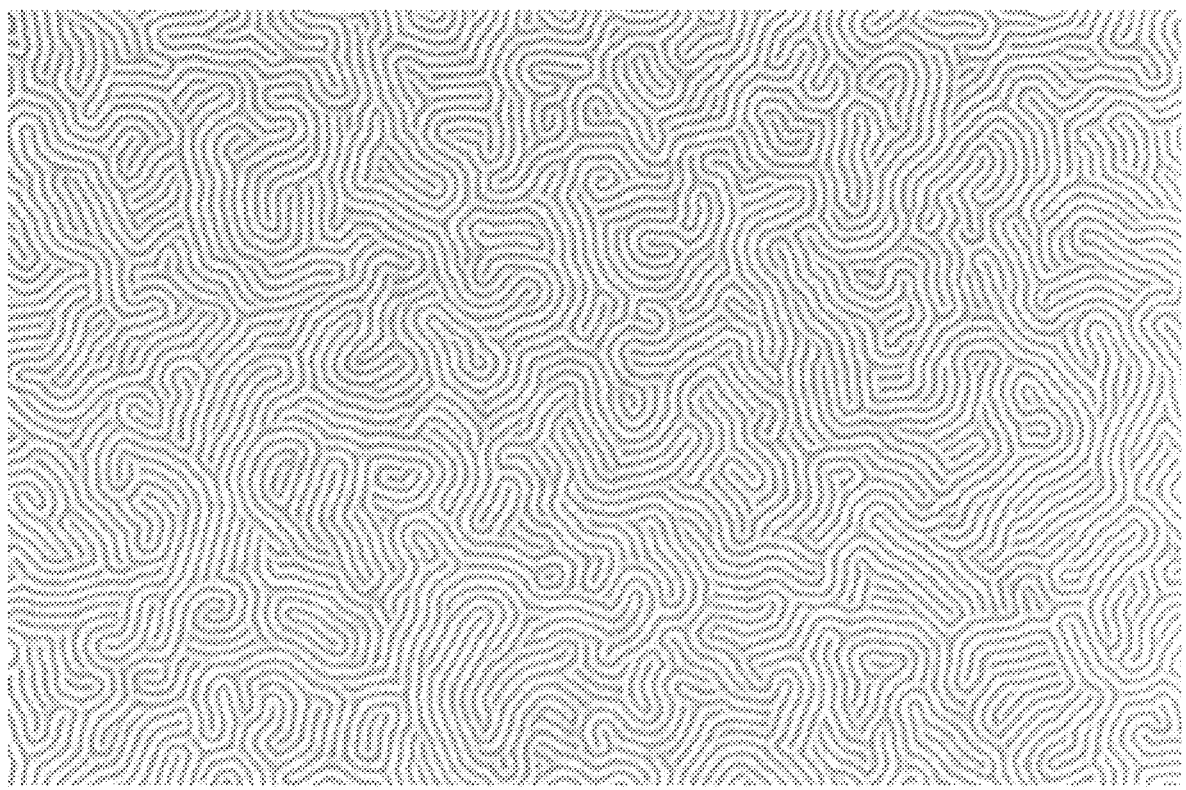
FIG. 6 is an SEM photograph (144 kx) showing a fingerprint obtained from the material of Example 4 with a high PLA loading.

FIG. 2 shows an SEM of the fingerprint obtained from the material from Example 2 with low PLA loading. FIG. 3 shows the fingerprint obtained from the material from Example 2 with high PLA loading. FIG. 4 shows the fingerprint obtained from the material from Example 3 with low PLA loading. FIG. 5 shows the fingerprint obtained from the material from Example 3 with high PLA loading. FIG. 6 shows the fingerprint obtained from the material from Example 4 with low PLA loading. FIG. 7 shows the fingerprint obtained from the material from Example 4 with high PLA loading.

We claim:

1. A method of forming a microelectronic structure, said method comprising:
   providing a stack comprising:
   a substrate having a surface; and
   one or more optional intermediate layers on said substrate surface;
   applying a composition to said intermediate layers, if present, or to said substrate surface, if no intermediate layers are present, said composition comprising a block copolymer comprising a first block and a second block, said first block being a copolymer that includes recurring monomers comprising lactic acid moieties that are present as side chains on said recurring monomers; and

TABLE 1

Properties of BCPs

| | PMMA $M_n$ | PS + PMMA $M_n$ | Total $M_n$ | Total PDI | Composition | $L_0$ (nm) | Neutral Window[E] |
|---|---|---|---|---|---|---|---|
| Example 2, Low[A] PLA | 13.1k | 31.8k | 35.4k | 1.12 | No VBP[C] | 26.3 | 20-70% |
| Example 2, High[B] PLA | 13.1k | 31.8k | 37.2k | 1.13 | No VBP | 27.1 | 15-60% |
| Example 3, Low PLA | 13.1k | 28.0k | 29.4k | 1.11 | 20 mol % VBP 35 mol % MES[D] | 24.2 | 40-80% |
| Example 3, High PLA | 13.1k | 28.0k | 30.6k | 1.12 | 20 mol % VBP 35 mol % MES | 24.9 | 20-60% |
| Example 4, Low PLA | 13.1k | 27.6k | 29.5k | 1.13 | 20 mol % VBP 40 mol % MES | 25.1 | 20-80% |
| Example 4, High PLA | 13.1k | 27.6k | 30.7k | 1.14 | 20 mol % VBP 40 mol % MES | 25.6 | 20-70% |

[A]"Low" is 0.2 g, or 16 wt % PLA.
[B]"High" is 0.2 g, or 23 wt % PLA.
[C]"VBP" refers to vinylbiphenyl.
[D]"MES" refers to methylstyrene.
[E]Mol % polystyrene causing said composition to self-assemble into a self-assembled layer, wherein said self-assembled layer comprises a first self-assembled region and a second self-assembled region different from said first self-assembled region.

2. The method of claim 1, wherein said recurring monomers are selected from the group consisting of 2-hydroxyethyl methacrylate monomers, 3-hydroxypropyl methacrylate, and mixtures thereof, and said lactic acid moieties are side chains on said recurring monomers.

3. The method of claim 1, wherein said first block further comprises recurring monomers of methyl methacrylate.

4. The method of claim 1, wherein said second block comprises recurring monomers selected from the group consisting of styrene, other styrene-containing monomers, alkyl vinylbenzyl ethers, vinylbenzyl ethers, vinylbiphenyl, vinylbenzocyclobutene, vinylnaphthalene, vinylphenanthrene, vinylanthracene, vinylanisole, vinylpyridine, vinylnaphthalate, and mixtures thereof.

5. The method of claim 1, said first block being a random copolymer.

6. The method of claim 1, wherein said first block comprises less than about 5% by weight methyl methacrylate side chains, based upon the total weight of the first block taken as 100% by weight.

7. The method of claim 1, wherein said causing comprises heating said composition to at least about the glass transition temperature of said block copolymer, said self-assembling occurring during said heating.

8. The method of claim 1, wherein said stack comprises an intermediate layer selected from the group consisting of bottom anti-reflective coatings, neutral brush layers, hardmask neutral layers, hardmasks, spin-on carbon layers, etch block layers, and imaging layers.

9. The method of claim 1, wherein said substrate is a semiconductor substrate.

10. The method of claim 1, further comprising removing said second self-assembled region to yield a pattern in said self-assembled layer.

11. The method of claim 1, wherein an intermediate layer is present, said intermediate layer comprising a pre-pattern comprising a plurality of raised features, said raised features being spaced apart and each being defined by respective sidewalls and a top surface, wherein said self-assembling composition is applied directly on top of said intermediate layer in spaces between said raised features.

12. The method of claim 11, wherein said plurality of raised features are formed by:
applying a photosensitive composition to form an imaging layer on any other intermediate layer, if present, or on said substrate surface, if no other intermediate layers are present; and
patterning said imaging layer to yield said pre-pattern, before applying said composition to said imaging layer.

13. The method of claim 1, wherein at least one intermediate layer is present, said intermediate layer being selected from the group consisting of hardmask layers and neutral layers, and wherein said intermediate layer comprises a surface having surface-modified regions and non-modified regions, said first and second self-assembled regions being adjacent said non-modified regions.

14. The method of claim 13, wherein, before applying said composition to said intermediate layer, said surface-modified regions and non-modified regions are formed by:
forming an imaging layer on said intermediate layer;
patterning said imaging layer to yield a pre-pattern, wherein said patterning comprises selectively removing portions of said imaging layer to uncover portions of said intermediate layer;
contacting said uncovered portions of intermediate layer with a developer or solvent to yield said surface-modified regions; and
removing remaining portions of said imaging layer from said intermediate layer to yield said non-modified regions.

15. The method of claim 13, wherein, before applying said composition to said intermediate layer, said surface-modified regions and non-modified regions are formed by selectively exposing said intermediate layer to radiation.

16. The method of claim 1, wherein said causing is carried out after said applying, without applying a further layer being formed on, or a second composition being applied to, said composition.

17. The method of claim 1, wherein said lactic acid moieties have respective number average molecular weights of from about 100 g/mol to about 5,000 g/mol.

* * * * *